United States Patent [19]

Andrews et al.

[11] Patent Number: 4,749,614

[45] Date of Patent: Jun. 7, 1988

[54] PROCESS FOR COATING FIBERS, USE THEREOF, AND PRODUCT

[75] Inventors: George L. Andrews; Anilkumar C. Bhatt, both of Endicott, N.Y.; Donald E. Doran, New Milford, Pa.; Leo E. Hunsinger, Binghamton, N.Y.

[73] Assignee: International Business Machines Corporation, Armonk, N.Y.

[21] Appl. No.: 849,976

[22] Filed: Apr. 10, 1986

[51] Int. Cl.$^4$ ................................................. B32B 7/00
[52] U.S. Cl. ........................... 428/290; 156/307.3; 156/307.4; 156/307.7; 156/308.6; 156/314; 427/389.8; 427/407.3; 428/251; 428/268; 428/413; 428/417; 428/447; 428/901
[58] Field of Search ............... 427/407.3, 389.8; 156/308.6, 307.3, 307.7, 307.4, 314; 428/285, 290, 251, 268, 447, 413, 417, 901

[56] References Cited

U.S. PATENT DOCUMENTS

| 2,700,010 | 1/1955 | Balz | 154/128 |
|---|---|---|---|
| 2,931,739 | 4/1960 | Marzocchi et al. | 117/126 |
| 3,027,274 | 3/1962 | Huntington et al. | 117/126 |
| 3,391,054 | 7/1968 | Lewis et al. | 161/186 |
| 3,523,037 | 8/1970 | Chellis | 117/119.6 |
| 3,562,081 | 2/1971 | Stalego | 161/93 |
| 3,972,765 | 8/1976 | Kondo et al. | 156/315 |
| 3,997,306 | 12/1976 | Hedden | 65/3 C |
| 4,118,540 | 10/1978 | Amort et al. | 428/447 |
| 4,218,513 | 8/1980 | Williams et al. | 428/419 |
| 4,362,783 | 12/1982 | Graham | 428/336 |
| 4,369,264 | 1/1983 | Baumann et al. | 523/209 |
| 4,499,145 | 2/1985 | Yanagida et al. | 428/418 |
| 4,500,600 | 2/1985 | Wong et al. | 428/391 |

FOREIGN PATENT DOCUMENTS

| 0055443 | 7/1982 | European Pat. Off. . |
| 0166240 | 6/1984 | European Pat. Off. . |
| 1332012 | 10/1973 | United Kingdom . |
| 1347186 | 2/1974 | United Kingdom . |
| 2054460 | 2/1981 | United Kingdom . |

OTHER PUBLICATIONS

Modern Plastics, Mar. 1974, pp. 74–78, Plueddemann, et al., "Catalytic and Electrokinetic Effects in Bonding Through Silanes".

Primary Examiner—James J. Bell
Attorney, Agent, or Firm—Pollock, Vande Sande & Priddy

[57] ABSTRACT

A fibrous substrate is coated with a hydrolyzed aminosilane. The aminosilane is hydrolyzed in an aqueous solution having a pH of 3.4 to 3.7. The substrate is useful for preparing fiber reinforced plastics such as prepreg polyepoxide substrates. Improved adhesion between the fibrous substrate and the polymer is obtained.

29 Claims, No Drawings

PROCESS FOR COATING FIBERS, USE THEREOF, AND PRODUCT

DESCRIPTION

TECHNICAL FIELD

The present invention is concerned with a method for coating fibers and the coated fibers. In addition, the present invention is concerned with producing fiber reinforced polyepoxide polymer products and the product obtained thereby. Of particular interest is a process for producing so-called prepreg polyepoxide substrates.

BACKGROUND ART

A number of fiber reinforced plastics are used commercially for various purposes. Articles such as sheets, tapes, or fabrics wherein fibers are impregnated with a resin such as an epoxy resin are referred to as "prepreg substrates". One important use of prepreg substrates is to provide a surface upon which a pattern of an electrical conductor can be provided to obtain circuit boards or circuit cards. The printed circuit boards or printed circuit cards are prepared from laminates of multiple layers of the fiber impregnated epoxy resin compositions. These laminates need to be resistant to various solvents since they are repeatedly exposed to processing solvents and vapors thereof. For instance, in many instances photoresists are stripped from the surface of metal, bonded to the surface of a laminate by exposing the photoresist to solvents which can cause leaching and softening of various materials.

Moreover, it is desired that the laminates be selfextinguishing and that the epoxy employed act as a fire retardant. The materials also should have a high heat distortion temperature in order to avoid warpage when exposed to high processing temperatures.

A further requirement for the epoxy composition is that it have sufficient adhesive power for bonding metal film to the surface of the laminate.

A still further concern is to provide tenacious adhesion between the fibrous substrate and the epoxy composition.

In order to enhance the adhesion between the epoxy composition and fibrous substrate, the substrates have been coated with silanes. Although the use of silanes and especially aminosilanes has proved to provide quite good adhesion with the epoxy compositions, there still remains room for additional enhancement in the bonding strength between the epoxy and the fibrous substrate.

In particular, the bond between the fibers and epoxy, although sufficient for many prepreg applications, permits some slippage of the fibers during the lamination process. This slippage, in turn, can cause dimensional movement of the epoxy-fiber laminate in the warp and fill directions.

SUMMARY OF INVENTION

The present invention is concerned with a process for coating a fibrous substrate with an aminosilane coupling agent. In particular, the process of the present invention comprises hydrolyzing the aminosilane coupling agent in an acidic aqueous solution having a pH of 3.4 to 3.7, and then coating the fibrous substrate with the hydrolyzed coupling agent.

The present invention is also concerned with coated fibrous substrates obtained by the above process.

In addition, the present invention is concerned with a method for fabricating fiber reinforced polymer products. The method includes hydrolyzing an aminosilane coupling agent with an acidic aqueous solution having a pH of 3.4 to 3.7. The fibers are then coated with the hydrolyzed coupling agent. The coated fibers are then coated with a composition containing the desired polymer.

The present invention is also concerned with a fiber reinforced polymer product obtained by the above process.

BEST AND VARIOUS MODES FOR CARRYING OUT INVENTION

The fibrous substrate employed in accordance with the present invention includes such materials as fiberglass, polyamides, and graphite. The preferred fibrous substrates are fiberglass or woven glass fabric.

Examples of some glass fabrics available include those having the standard designations 1675, 116, 7628, 108, and 1080.

In order to improve the bond between the polymer and fibers, the fibers are coated with a hydrolyzed aminosilane coupling agent. It is essential to the success of the present invention that the hydrolysis of the silane be carried out at a pH of 3.4 to 3.7. In addition, the silanes must include an amine group or substituted amine functional group such as styryl amine group. Such silane coupling agents are well-known in the art.

Suitable organo silanes can be represented by the following formula:

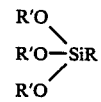

wherein R' is a hydrocarbon group and usually an alkyl of 1-6 carbon atoms and preferably 1-2 carbon atoms and R is an amino-substituted alkyl radical in which the alkyl groups have from 1-6 carbon atoms.

Examples of some specific silanes which are suitable are N-beta, (aminoethyl)-gamma-aminopropyltrimethoxy silane, available under the trade designation Union Carbide A1120; gamma aminopropyltrimethoxy silane Union Carbide A 1100; and N (vinylbenzylaminoethyl) gamma aminopropyltrimethoxy silane, available under the trade designation Dow Corning Z6032. Mixtures of silanes can be employed if desired.

Also, if desired, other silane coupling agents can be employed in admixture with the amine silane. Such silanes contain an organofunctional group such as a vinyl, an epoxy, or a methacrylate group. Examples of such silanes are gamma glycidoxypropyltrimethoxy silane, available under the trade designations Dow Corning Z6040 and Union Carbide A187; vinyltrimethoxy silane A172 or Z6075; (beta-3,4-epoxycyclohexyl)ethyltrimethoxy silane, and methacrylpropyl trimethoxy silane (A174 or Z6030).

In accordance with the present invention, it is essential that the aminosilane be hydrolyzed in water at a pH of 3.4 to 3.7. The hydrolysis usually is completed in about ½ to 1 hour. In addition, the aminosilane solution is usually used within about 12 hours and preferably within about 8 hours after hydrolysis of the aminosilane in order to ensure against excessive polymerization and condensation prior to use.

The hydrolysis is preferably carried out at normal room temperatures (usually about 70°–75° F.) and at a maximum relative humidity of about 60%.

The pH of the water for the hydrolysis can be obtained by adding a water soluble organic carboxylic acid such as formic acid, acetic acid, or oxalic acid, and preferably formic acid. Generally, amounts of the acid of about 0.5% by weight and less are sufficient to obtain the desired pH.

It is preferred not to employ inorganic mineral acids such as HCl and $H_2SO_4$ for obtaining the desired pH since such acids tend to add ions to the water to an extent that adversely effects the bond of the coupling agent with the fiber. It is believed that the ions are attracted to the fibers and come between the fibers and coupling agent.

The aqueous solutions generally contain about 0.1% to about 1.5% by weight of the aminosilane coupling agent.

It is believed that in accordance with the present invention, the specific hydrolysis avoids protonizing amines during hydrolysis and thus allows more sites to crosslink with polymer. This, in turn, is believed to increase the cross-link density at the interface of the fiber and polymer and reduce slippage during lamination. Accordingly, controlled dimensional stability is achieved.

After the aminosilane is hydrolyzed, the fibers such as glass fabric commonly about 2 mils to about 10 mils in thickness is impregnated with the hydrolyzed silane such as by dipping the fabric through an aqueous solution of the aminosilane in its hydrolyzed form.

During the coating of the fabric, the pH of the silane solution should be between about 3.4 and about 4.0 for best results.

Since alkali is normally present on the glass when received, the pH of the silane solution during the coating procedure, can shift upwards from the pH required during the hydrolysis due to dissolution of the alkali therein. For best results, the pH of the amino silane solution should be maintained throughout the coating in the desired range which can be accomplished by limiting the amount of product going through any particular silane solution, or by adding additional fresh hydrolyzed silane solution during use, or by prewashing the glass substrate to remove alkali which is normally present. Temperature of the bath should be controlled.

After the glass cloth is removed from the aqueous silane composition, excess material on the glass fibers can be removed by squeezing the fabric between doctor rolls.

The coupling agent is generally employed in amounts of at least about 0.1% by weight, preferably about 0.1% to about 0.4% by weight, and most preferably about 0.2% to about 0.3% by weight based upon the weight of the fiber. For a discussion of the most preferred amounts of coupling agent, see U.S. patent application Ser. No. 797,555 to Bhatt, et al., filed on Nov. 13, 1985, and entitled "Process for Preparing Epoxy Product and Product", disclosure of which is incorporated herein by reference.

The glass cloth containing the silane coating is then dried in an oven at temperatures between about 38° C. and about 177° C. and preferably between about 116° C. and about 121° C. to remove water and cause the desired polymerization of the silane. The residence time in the oven is about 5 seconds to about 7 minutes and preferably about 7 to about 10 seconds.

The fibers containing the aminosilane are then coated with the desired polymer composition.

Polymer compositions of thermosetting polymers can be reinforced with the fibers coated pursuant to the present invention.

Typical thermosetting polymeric materials include epoxy, phenolic-based materials, polyimides, and polyamides. Examples of some phenolic-type materials include copolymers of phenol, resorcinol, and cresol.

The preferred polymers are thermosetting polymers and most preferably are the epoxy polymers.

Typical epoxy resins include bisphenol A type resins obtained from bisphenol A and epichlorohydrin, and from brominated bisphenol A and epichlorohydrin, resinous materials obtained by the epoxidation of novolak resins produced from a phenolic material such as phenol and an aldehyde such as formaldehyde with epichlorohydrin, polyfunctional epoxy resins such as polyglycidyl ethers of tetraphenylene and tetraglycidyldiaminodiphenyl methane, and alicyclic epoxy resins such as bis (3,4-epoxy-6-methyl-cyclohexylmethyl) adipate. The most preferred epoxy employed is of the brominated bisphenol A type. In addition, mixtures of epoxy resins can be employed when desired.

The epoxy resinous compositions also can contain curing agents and accelerating agents as well-known in the art.

Examples of suitable curing agents include anhydrides such as chlorendic anhydrides, nadic anhydride, methyltrimellitic anhydride; carboxylic acids; polyamides; polysulfides; urea-phenolformaldehydes; polyamines; primary, and secondary, and tertiary amines. The preferred curing agent in the preferred epoxy compositions employed in the present invention is dicyandiamide. Moreover, mixtures of such with tertiary amines provide for faster curing rates. Such tertiary amines include benzyldimethyl amine, α-methyl benzyldimethyl amine, dimethylaminomethylphenol, tris(dimethylaminomethylphenol), and N,N,N',N'-tetramethyl-1,3-butanediamine.

In addition, the epoxy resin is generally applied in the form of a solution in a suitable organic solvent. Suitable solvents include ketones such as acetone and methylethyl ketone; ethers such as ethylene glycol monomethyl ether; dimethylformamide, N-methyl pyrrolidone, and propylene glycol monomethylether.

The preferred epoxy compositions employed in accordance with the present invention are disclosed in U.S. Pat. No. 3,523,037, disclosure of which is incorporated herein by reference.

In general, the preferred epoxy compositions employed in the present invention are comprised of an epoxy resin having a high functionality of from about 3.5 to about 6, a second epoxy resin having a relatively low functionality of about 1.7 to about 2, a curing agent, and a curing catalyst such as a tertiary amine. The second epoxy resin may be halogenated or non-halogenated.

In a more preferred aspect, such compositions contain a brominated epoxy resin in an amount of about 70 to about 92 parts and preferably about 88 to about 91 per hundred parts by weight of the resin solids in the composition; a tetrafunctional epoxy resin in an amount of about 8 to about 30 parts and preferably about 9 to about 12 parts by weight per hundred parts by weight of the resin solids in the composition; dicyandiamide in a amount of about 3 to about 4 parts by weight per hundred parts by weight of solids in the composition; about 0.2 to about 0.4 parts by weight per hundred parts by weight of solids in the composition of a tertiary amine; about 40 parts by weight based upon the total weight of the composition of ethylene glycol monomethyl ether; and methylethyl ketone in an amount necessary to provide a specific gravity of about 1.085±0.005 to the composition.

The brominated epoxy resin is based on polyglycidyl ether of tetrabromobisphenol A and can be prepared from tetrabromobisphenol A and epichlorohydrin. Such has a functionality of about 2, an epoxide equivalent weight of about 455 to about 500, and a bromine content of about 19% to about 23% by weight. Such can be obtained under the trade designation Araldite 8011 from CIBA Products Company as a solution containing about 75% epoxy resin by weight of methylethyl ketone. Also, such can be obtained under the trade designation DER-511 from the Dow Chemical Company as an 80% solution of the resin in methylethyl ketone.

The tetrafunctional epoxy resin is the polyglycidyl ether of tetraphenylene and is prepared from tetra bis (hydroxyphenyl) ethane and epichlorohydrin. The epoxy resin has an average functionality of about 4 and an epoxide equivalent weight of about 210 to about 240. Such is available under the trade designation Epon 1031 from the Shell Chemical Corporation as a solution containing about 80% by weight of solids in methylethyl ketone. Such is also available under the trade designation Araldite 0163 from CIBA Geigy Company.

Other suitable multifunctional epoxides are epoxidized novolak such as CIBA 12XX series and Dow 4XX series.

The amount of polymer employed is about 25% to about 65% by weight of polymer solids based upon the glass fabric. The glass fabric is coated with the polymer composition such as the epoxy composition in the same manner as disclosed in U.S. Pat. No. 3,523,037, disclosure of which is incorporated herein by reference.

In particular, when an epoxy is employed, the fabric is directed into a container containing the epoxy composition. After being impregnated, the fabric is then passed through a pair of doctor rolls whereby excess epoxy resin solution is removed from the surface of the woven fabric.

After combining with the reinforcing fibers, the epoxy composition is then cured to the B-stage and molded to the desired shape, such as a sheet.

When sheets are employed, the thickness is usually about 1.5 mils to about 12 mils and preferably about 2 mils to about 7 mils.

The curing to the B-stage is generally achieved by using temperatures between about 93° C. and about 177° C. and for times of about 3 minutes to about 10 minutes.

The now impregnated fabric or prepreg can be divided into sheets of desired size in preparation for lamination to form the printed circuit board. The number of sheets of prepreg in any given laminate will depend upon the thickness and weight per unit area of the original glass cloth, the ratio of resin to glass in the prepreg, laminating pressure, and other factors. The number of sheets may vary from 1 to 20 or more, depending on the above factors. Typically, about 2 sheets of the prepreg are interleaved between sheets of electrolytic copper foil and placed between two polished metal plates.

This assembly of prepregs and metal plates and copper foils is then placed between platens of a laminating press. The platens are cored for steam or super-heated water so that they can be heated to elevated temperatures.

The above assembly is subjected to pressures which may vary from about 50 psi to about 2000 psi, depending upon the resin content, flow of the prepreg, and laminate temperatures. Preferably, the pressures are about 200 psi to about 500 psi and most preferably about 250 psi to about 300 psi. The laminate temperature is preferably about 150° C. to about 200° C.

The time of the pressing operation is variable, depending upon the particular materials employed and the pressure applied. About 1 hour is adequate for the above conditions.

The following non-limiting examples are further presented to illustrate the present invention.

EXAMPLE 1

An aminosilane composition containing about 0.7% by weight of N(vinylbenzylaminoethyl) gamma aminopropyltrimethoxy silane Z6032; about 0.3% to about 0.4% by weight of methacrylpropyl trimethoxy silane, A174; and about 0.1% by weight of formic acid and having a pH of 3.4–3.6 is hydrolyzed at normal room temperatures for about 1 hour.

A roll of woven glass fabric having the general designation as 108 is impregnated with the hydrolyzed solution with the pH being maintained during the impregnation between about 3.4 and about 4.0. The fabric is removed from the solution and excess silane composition is removed by squeezing between two doctor rolls. The fabric is placed in an oven and heated to about 116° F. to about 121° F. for about 5 to 10 seconds in order to remove water and cause polymerization of the silane. The fabric contains about 0.1% to 0.4% by weight of the silane.

Next, the fabric is coated with an epoxy composition. The epoxy composition is compounded as follows: forty parts by weight of ethyleneglycolmethylmonoether is placed in a jacketed vessel equipped with a propeller type stirrer. This solvent is heated to about 110° F.±15° F. with agitation by circulating hot water through the jacket of the mixing vessel. When the solvent reaches a temperature of about 100° F., four parts of dicyandiamide are added thereto. Agitation is continued for 30 to 90 minutes to completely dissolve the dicyandiamide. When the dicyandiamide has been dissolved, the solution is cooled to about room temperature.

In a separate mixing tank about 141 parts of a 71% solution of 90% by weight Araldite 8011 and about 10% weight of Araldite ECN 1280 in methylethyl ketone are mixed out with a premix of about 3 parts by weight of dicyandiamide and about 50 parts by weight of ethylene glycol monomethylether solution is then added to the epoxy resin solution with stirring.

Next, about 0.2 to about 0.4 parts by weight of N,N,N',N'-tetramethyl-1,3-butane diamine is added with stirring.

The resulting solution is adjusted to a specific gravity of about 1.090 to about 1.124 by the addition of methylethyl ketone.

After the sheet is removed from the epoxy solution, the fabric is passed through a pair of doctor blades to remove excess epoxy solution therefrom. The amount of epoxy solids to glass fabrics employed is about 60±3 percent of the total mixture.

The glass fabrics are then placed in an oven to cure the epoxy to the partially cured B-stage by heating at temperatures between about 93° C. and about 121° C.

for about 1 minute followed by about 2 minutes at about 149° C. and then about 1 minute at about 138° C. to about 160° C.

The B-staged impregnated glass fabric, referred to as prepreg, is cut into pieces of proper size for lamination into copper clad prepreg substrates. Thin substrates referred to as cores are laminated first with two to five layers of prepreg between two layers of copper.

The core lamination is carried out at temperatures of about 300° F. to about 370° F. and pressures of about 500 psi.

The cores are processed through a conventional circuiting photolithographic process and prepared for final lamination into multi-layer substrates.

The cores which are now C-staged, or fully cured, from the core lamination are intermixed with the desired number of prepreg layers between them and laminated into copper clad multi-layer substrates at pressures of about 300 psi and temperatures of about 340° F.

During the multi-layer substrate lamination process, the C-staged core substrate is subject to pressure and resultant movement. Movement is determined through use of X-ray and expressed in parts per million (ppm) shrinkage or growth.

Movement can be controlled through control of the pH of the coupling agent during the hydrolysis of the silane.

TEST RESULTS:

| pH Range during hydrolysis | pH Range during silane application | Shrinkage (ppm) | |
|---|---|---|---|
| (3.4–3.7) | (3.4–4.0) | | |
| | Signal core | Substrate long dimension | 649 |
| | | Substrate short dimension | 742 |
| | Power core | Substrate long dimension | 344 |
| | | Substrate short dimension | 224 |
| (3.9–4.1) | (4.0–4.8) | | |
| | Signal core | Substrate long dimension | 427 |
| | | Substrate short dimension | 431 |
| | Power core | Substrate long dimension | 77 |

The greater shrinkage level for the pH range of 3.4–3.7 as compared to pH range 3.9–4.1 demonstrates a significant reduction in slippage achieved by the present invention.

EXAMPLE 2

Example 1 is repeated, except that the glass fabric employed is referred to as 1675 and the amount of epoxy is about 52±2% by weight of solids in the final composition. The results obtained are similar to those of Example 1.

EXAMPLE 3

Example 1 is repeated, except that the glass fabrics employed are those designated as 106 and the amount of epoxy is about 60% to about 68% by weight of the combination of glass fabric and epoxy solids. The results obtained are similar to those of Example 1.

Having thus described our invention, what we claim as new and desire to secure by Letters Patent is:

1. A method of coating a fibrous substrate with an aminosilane coupling agent which comprises hydrolyzing said coupling agent in an acidic aqueous solution having a pH of 3.4 to 3.7 and then coating said fibrous substrate with the hydrolyzed coupling agent.

2. The method of claim 1 wherein said fibrous substrate is fiberglass.

3. The method of claim 1 wherein said silane is an aminosilane represented by the formula:

wherein R' is a hydrocarbon group and R is an amino-substituted alkyl radical wherein the alkyl groups have from 1 to 6 carbon atoms.

4. The method of claim 6 wherein R' is an alkyl group of 1 to 6 carbon atoms.

5. The method of claim 1 wherein said silane contains N(vinylbenzylaminoethyl)gamma aminopropyltrimethoxy silane.

6. The method of claim 1 wherein said aqueous solution contains an acid selected from the group of acetic acid, formic acid, oxalic acid, or mixtures thereof.

7. The method of claim 6 wherein acid includes formic acid.

8. The method of claim 1 wherein the pH of the aqueous solution during the coating is about 3.4 to about 4.0.

9. The method of claim 1 wherein the hydrolysis is carried out at about normal room temperature and controlled.

10. The method of claim 1 wherein the amount of silane is at least about 0.1% by weight based upon the fibrous substrate.

11. Coated fibrous substrate obtained by the method of claim 1.

12. A method for fabricating a composite of a synthetic polymer reinforced with fibers which comprises coating said fibers with an aminosilane coupling agent which comprises hydrolyzing said coupling agent in an acidic aqueous solution having a pH of 3.4 to 3.7, then applying said coupling agent to the fibers, and then coating the coated fibers with the synthetic polymer.

13. The method of claim 12 wherein said fibers are glass fibers.

14. The method of claim 12 wherein said polymer is a polyepoxide.

15. The method of claim 14 wherein said polyepoxide is a brominated polyepoxide.

16. The method of claim 12 wherein said silane is an aminosilane represented by the formula:

wherein R' is a hydrocarbon group and R is an amino-substituted alkyl radical wherein the alkyl groups have from 1 to 6 carbon atoms.

17. The method of claim 16 wherein R' is an alkyl group of 1 to 6 carbon atoms.

18. The method of claim 12 wherein said silane contains N(vinylbenzylaminoethyl)gamma aminopropyltrimethoxy silane.

19. The method of claim 12 wherein said aqueous solution contains an acid selected from the group of acetic acid, formic acid, oxalic acid, or mixtures thereof.

20. The method of claim 19 wherein acid includes formic acid.

21. The method of claim 12 wherein the pH of the aqueous solution during the coating is about 3.4 to about 4.0.

22. The method of claim 12 wherein the hydrolysis is carried out at about normal room temperature.

23. The method of claim 12 wherein the amount of silane is at least about 0.1% by weight based upon the fibers.

24. The method of claim 14 wherein the amount of epoxy is about 25% to about 65% by weight based upon the amount of fibers.

25. The method of claim 14 which further includes curing the epoxy to the B-stage.

26. The method of claim 25 wherein said curing is carried out by heating at temperatures between about 160° C. to about 200° C.

27. A composite obtained by the composite of claim 12.

28. A process for preparing a laminate which comprises hydrolyzing an aminosilane coupling agent in an acidic aqueous solution having a pH of 3.4 to 3.7, then applying said coupling agent to the fibrous substrate at pH 3.4 to 4.0, then coating the substrate with a composition containing a polyepoxide, curing the epoxide to its B-stage and pressing together multiple layers of the substrate containing the silane and polyepoxide; and then further curing the epoxy.

29. A process for preparing a laminate which comprises hydrolyzing an aminosilane coupling agent in an acidic aqueous solution having a pH of 3.4 to 3.7; then applying said coupling agent to the fibrous substrate at a pH of 3.4 to 4.0; then coating the substrate with a composition containing a thermosetting polymer, pressing together multiple layers of the substrate containing the silane and thermosetting polymer; and then curing the thermosetting polymer.

* * * * *